(12) United States Patent
Goudarzi (10) Patent No.: US 7,167,375 B2
(45) Date of Patent: Jan. 23, 2007

(54) POPULATED PRINTED WIRING BOARD AND METHOD OF MANUFACTURE

(75) Inventor: Vahid Goudarzi, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 100 days.

(21) Appl. No.: 10/758,822

(22) Filed: Jan. 16, 2004

(65) Prior Publication Data
US 2005/0157476 A1    Jul. 21, 2005

(51) Int. Cl.
H05K 7/16    (2006.01)
B23P 19/00    (2006.01)

(52) U.S. Cl. .................. 361/760; 174/257; 29/729; 361/767; 361/768

(58) Field of Classification Search ........... 361/760, 361/767–768, 743; 174/259, 263, 257, 260, 174/261; 228/180.1, 180.21, 180.22, 180.5, 228/178; 29/729, 841

See application file for complete search history.

(56) References Cited

U.S. PATENT DOCUMENTS

| | | | |
|---|---|---|---|
| 5,400,221 A * | 3/1995 | Kawaguchi | 361/771 |
| 5,729,896 A * | 3/1998 | Dalal et al. | 29/840 |
| 6,189,203 B1 | 2/2001 | Heinrich et al. | |
| 6,457,632 B1 * | 10/2002 | Teshima et al. | 228/246 |
| 6,479,755 B1 * | 11/2002 | Kim et al. | 174/250 |
| 6,642,485 B1 * | 11/2003 | Goenka et al. | 219/400 |
| 6,695,200 B1 * | 2/2004 | Suzuki et al. | 228/180.22 |
| 6,698,468 B1 * | 3/2004 | Thompson | 141/86 |
| 6,722,028 B1 * | 4/2004 | Nakamura | 29/832 |
| 6,900,383 B1 * | 5/2005 | Babb et al. | 174/35 MS |
| 6,902,102 B1 * | 6/2005 | Tanabe et al. | 228/260 |
| 2002/0067486 A1 * | 6/2002 | Forney et al. | 356/448 |
| 2003/0081393 A1 * | 5/2003 | Yokoyama | 361/767 |
| 2003/0175146 A1 | 9/2003 | Yeh | |
| 2004/0020566 A1 * | 2/2004 | Cavallotti et al. | 148/269 |
| 2004/0062015 A1 * | 4/2004 | Belopolsky | 361/760 |

OTHER PUBLICATIONS

"Lead-Free Mandate Plumbs New Design Challenges"—Schweber, Bill; www.ednmag.com, Apr. 18, 2002.
"Fujitsu Develops Advanced Printing Bump Technology"—Fujitsu Laboratories; http://pr.fujitsu.com/en/news/2001/12/12-1.html, Dec. 12, 2001.
"A Constitutive Model for Creep of Lead-Free Solders Undergoing Strain-Enhanced Microstructural Coarsening: A First Report"—Dutta, I; Journal of Electronic Materials, 2002.

* cited by examiner

*Primary Examiner*—Kammie Cuneo
*Assistant Examiner*—Hoa C. Nguyen
(74) *Attorney, Agent, or Firm*—Scott M. Garrett (57) ABSTRACT

A populated printed wiring board (PWB) (100) and method of manufacturing the populated PWB are taught. The populated PWB is manufactured by fabricating a PWB (102, 402) with exposed copper pads (302), coating the copper pads with an organic solderability preservative (OSP) (404), depositing a solder paste that includes lead-free solder on the OSP covered copper pads (406), placing components (408) and heating the PWB above a liquidous temperature of the lead-free solder in an air atmosphere (410). The process allows very close spacing of components and component leads while forming reliable solder joints to components that are mechanically stressed and components that have non-negligible planarity or coplanarity tolerances.

29 Claims, 5 Drawing Sheets

POPULATED PRINTED WIRING BOARD AND METHOD OF MANUFACTURE

FIELD OF THE INVENTION

The present invention relates in general to populated printed circuit board manufacturing. More particularly, the present invention relates to printed circuit boards that include very closely spaced pads for, closely spaced components for reduce product size and also include solder joints for components that are mechanically stressed and/or components that have non-negligible planarity or coplanarity tolerances.

BACKGROUND OF THE INVENTION

As microelectronic technology has progressed, the degree of circuit integration in microchips has increased to the point that complete electronic devices such as cellular telephones, cameras or handheld computers typically comprise a relatively small number of microchips, along with some discrete components (e.g., resistors, capacitors) connected together on a printed wiring board (PWB).

There are two commonly known types of PWB technologies: the older technology in which component leads are soldered in holes drilled through the PWB, and the currently favored technology in which components leads are soldered to pads on the surface of the PWB. The latter is referred to as surface mount technology (SMT).

Highly integrated microchips often require a large number of external connections. External connections to printed wiring boards are made through leads of packages which enclose the microchips. Each connection between a lead and the PWB takes up a certain amount of space that is determined by a lead traverse dimension (corresponding to PWB pad transverse dimension), and a minimum inter-pad spacing. The minimum inter-pad spacing is dictated by the need to avoid inter-pad short circuits caused by solder bridges. The number of external connections required for a given microchip may be so large as to determine a lower bound on the size of the package for the microchip. That is to say, in order to accommodate the number of leads while maintaining lead spacing the chip package must have a certain size. Thus, even though the microchip itself is highly miniaturized, a large package is necessitated, thereby negating, in certain respects the great expense incurred in miniaturizing the microchip.

Circuits typically include a number of discrete components (e.g., resistors, capacitors). In fact, for many circuits, discrete components take up most of the surface area of the PWB. The area taken up by discrete components is, of course, determined by the size of the discrete components and the required inter-pad spacing. As in the case of packaged microchips, the required inter-pad spacing is dictated by the need to avoid solder shorts. Thus, it is generally desirable to be able to reduce the inter-pad spacing.

In handheld devices, such as portable computers, cameras and cellular telephones, it is particularly important to control the space occupied by circuitry so that the overall size of the handheld device is not excessive and/or so that more functionality can be included in the handheld device. For handheld devices, a single PWB may be used to mechanically support and electrically connect a wide variety of parts including microchips, discrete components, electrical connectors, and EMI/RFI shields. (One use of EMI/RFI shields is to shield RF components mounted on cellular telephone printed wiring boards). In the interest of cost reduction, which is a particular concern for mass produced consumer devices such as cellular telephones, it is desirable to secure all components using solder applied in a single soldering procedure. However, the inclusion of disparate types of devices places conflicting demands on the soldering process by which components are secured to the PWB.

In particular, for microchips and discrete components (e.g., capacitors, resistors) which are not stressed it is desirable to be able to reduce the inter-pad spacing as much as possible. In the past in order to reduce the inter-pad spacing, without incurring electrical shorts due to solder bridges the thickness of solder paste applied to the PWB has been reduced.

However, if components such as electrical connectors which are mechanically stressed are to be included on a PWB it is desirable to secure these with high strength solder joints. In the past engineers resorted to through hole mounting in order to secure mechanically stressed components such as electrical connectors. However, in the interest of simplified more cost effective manufacturing it is desirable to use a single SMT soldering process to secure all components. Conventional wisdom dictates that in order to secure mechanically stressed components using SMT a thicker layer of solder paste be applied, however this is at odds with the above mentioned goal of reducing pad size and inter-pad spacing for microchips and discrete components.

RFI/EMI shields present their own challenges to the solder process. A common type of RFI/EMI shield that is used in handheld devices including cellular telephones is die formed from a piece of flat metal stock into a rectangular or irregularly shaped shallow tub. The rim of the tub is soldered to a congruently shaped closed curve trace on the PWB. For the shield to function effectively it is important that a continuous solder joint be formed all around between the rim and the trace on the PWB. In real world production there is often some appreciable tolerance on the flatness (planarity) of the rim of the shield. Addressing the imperfections in the flatness of the shield calls for using a thicker solder paste, however this is again in conflict with the desire to reduce the inter-pad spacing for the microchips and discrete components.

For large chip packages with multiple leads there may also be a substantial tolerance on the coplanarity of the many leads. Addressing the coplanarity tolerance also calls for using a thicker solder paste, in conflict with the desire to reduce inter-pad spacing.

What is needed is a SMT solder process that is able to achieve reduced inter-pad spacing for microchips and discrete components, is able to secure large components that are mechanically stressed such as electrical connectors, is also able form continuous solder joints to imperfectly flat components, and do so all on a single board with a single soldering procedure.

BRIEF DESCRIPTION OF THE FIGURES

The present invention will be described by way of exemplary embodiments, but not limitations, illustrated in the accompanying drawings in which like references denote similar elements, and in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figures 1, 3:
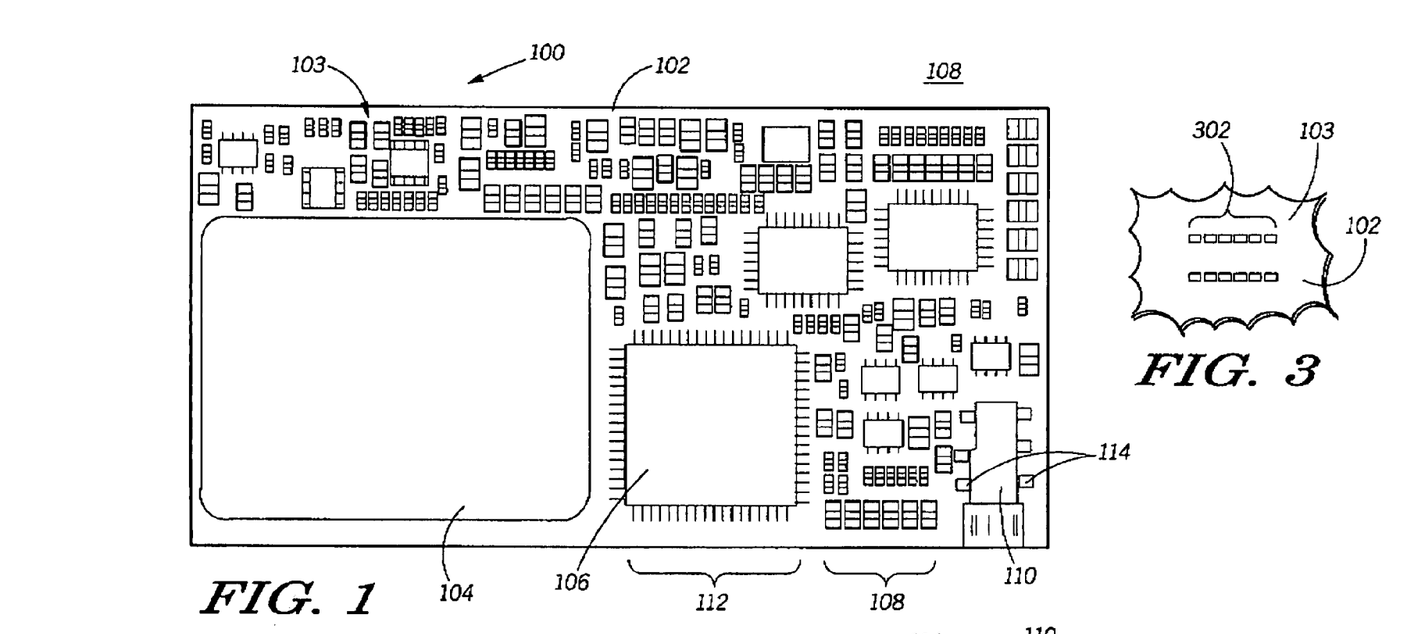
FIG. 1 is a top view of an embodiment of a populated printed wiring board.
FIG. 3 is a fragmentary top view of the printed wiring board shown in FIG. 1, with components removed to show a grouping of pads.
Figure 2:
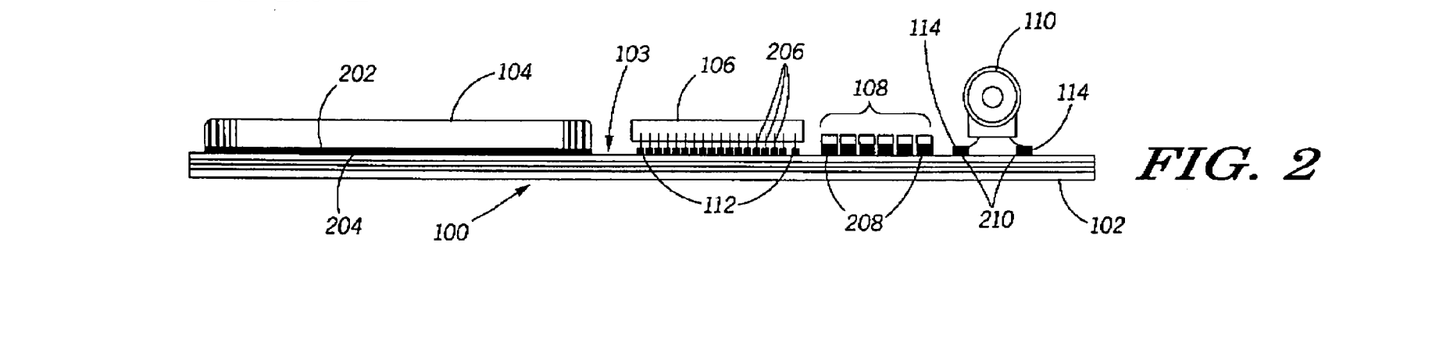
FIG. 2 is a side view of the populated printed wiring board shown in FIG. 1.

FIG. 1 is a top view of an embodiment of a populated printed wiring board (PWB) 100 and FIG. 2 is a side view of the populated PWB 100 shown in FIG. 1. The populated PWB 100 includes a PWB proper 102, to which many components are attached. In FIG. 1 a major surface 103 of the PWB 102 is visible. The components attached to the major surface 103 of the PWB 102 are of many different types, and as discussed above place disparate demands on a soldering process by which they are attached to the printed wiring board 102. The components mounted on a first major surface 103 of the PWB include, for example, an RFI/EMI shield 104, a quad pack microchip package 106, a plurality of discrete components 108 (e.g., resistors or capacitors), and a connector 110.

The shield 104 includes a lower rim 202 that is soldered to a congruently shaped trace (not shown) on the PWB 100 by a bead of solder 204. The microchip package 106 includes a plurality of leads 112 that are individually attached by solder joints 206 (one for each lead 112) to pads (not visible in FIGS. 1–2) of the PWB 102 that are located beneath distal ends of the leads 112. Similarly, each terminal of the discrete components 108 is attached to a pad (not visible in FIGS. 1–2) of the PWB 102 by a solder joint 208 (one for each terminal of each discrete component 108). Additionally the connector 110 includes leads 114 that are attached to pads (not visible in FIGS. 1–2) of the PWB by solder joints 210.

FIG. 3 is a fragmentary top view of the printed wiring board 102 shown in FIG. 1, with components removed to show a grouping of pads 302. The pads 302 are spaced by a very small inter-pad spacing. The inter-pad spacing is in certain cases below 0.25 mm and can be as low as 0.05 mm. The pads 302 can be used for a microchip package that has leads that are spaced by the same inter-pad spacing, or for discrete components that are closely spaced. Although not all pads on the PWB 102 will necessarily be spaced as closely as the minimum achievable inter-pad spacing, the ability to space pads by less than 0.25 mm enables the populated PWB 100 to be reduced in size, and/or more circuits to be included on the populated PWB 100. The ability to space the pads closely also allows the length of conductive pathways to be reduced thereby improving electrical performance.

All of the aforementioned components 104, 106, 108, 110 are secured to the PWB 102 using a surface mount technology (SMT) soldering process. In such a SMT soldering process it is expedient, and cost effective to apply solder paste for the entire PWB in one operation. Using a stencil to apply solder paste is one suitable way to apply solder paste in one operation. However, as discussed above in the background section, different thicknesses of solder are preferred for different types of components. For components with closely spaced leads or for components that are closely spaced accepted practice is to reduce the thickness of solder paste. On the other hand, for components with significant coplanarity or planarity tolerance such as the shield 104, or certain large microchip packages, or for components that are stressed such as the connector 110, accepted practice is to increase the thickness of solder paste. So called 'step down' stencils enable to different thickness of solder paste to be applied to different areas of printed wiring boards, but regrettably such stencils are plagued by the problem of fouling with dried solder.

Figure 4:
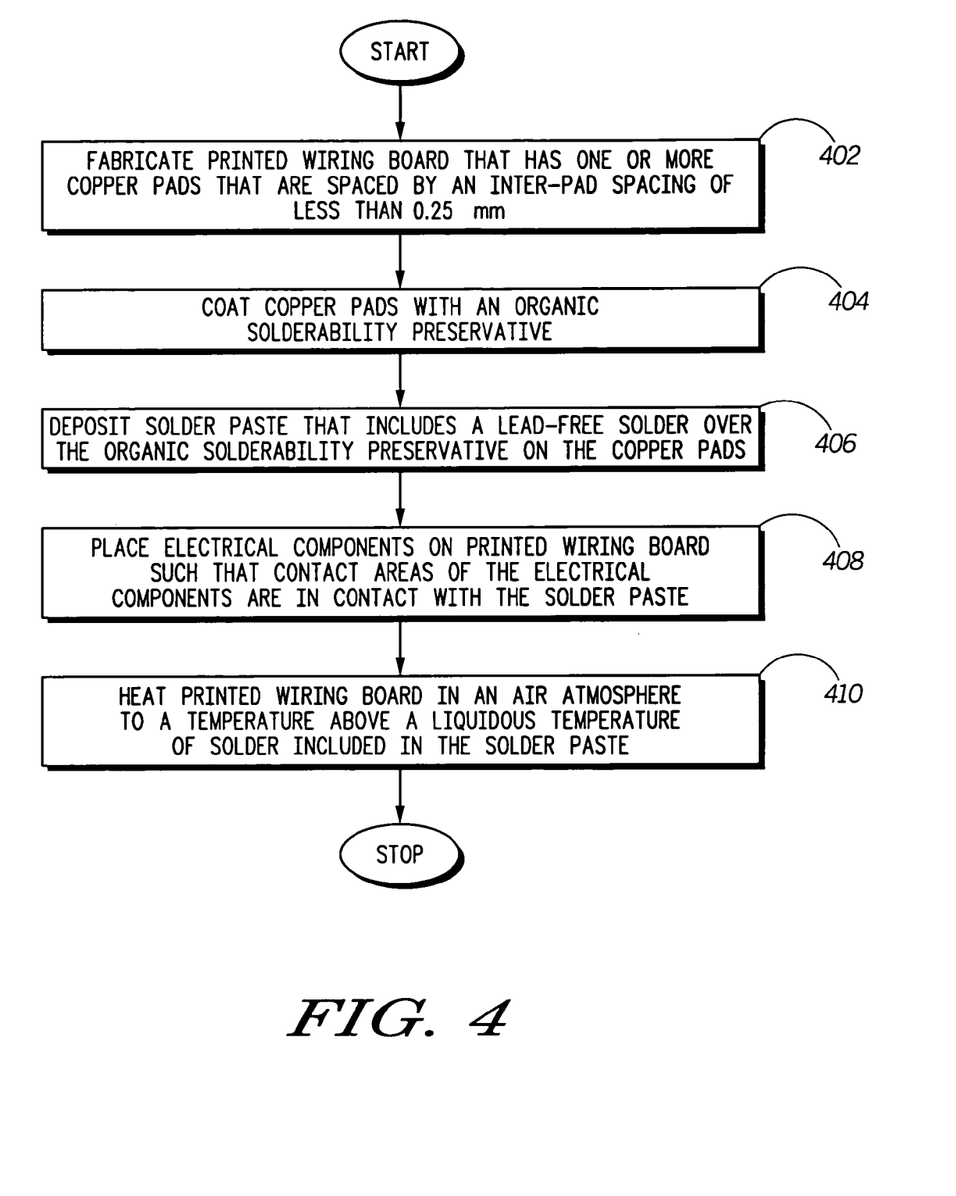
FIG. 4 is a flow chart of an embodiment of a process of manufacturing a populated printed wiring board.

FIG. 4 is a flow chart of an embodiment of a process of manufacturing a populated PWB that allows the goals for soldering a variety of types of components discussed above to be met. Referring to FIG. 4, in block 402 a PWB that has one or more copper pads that are spaced by an inter-pad spacing of less than 0.25 mm is fabricated. Aside from the inter-pad spacing, the fabrication of the PWB can be accomplished by known techniques. In a subtractive process in which a continuous film of copper is selectively etched to form copper pads, reduction in the inter-pad spacing is suitably effected by reducing the spacing of corresponding features in artwork (photolithography masks) used to pattern a resist layer that is used in etching the continuous film to form the copper pads.

In block 404 the copper pads are coated with an organic solderability preservative (OSP). Coating is readily accomplished by dip coating in a solution of the OSP. Appropriate organic solderability preservatives for use in the process include substituted benzimidazole, benzotriazoles, and imidazole. A suitable OSP which is a form of substituted benzimidazole is sold under the trade name Entek by Cookson Electronics of West Haven, Conn.

In block 406 a solder paste that includes a lead-free solder is deposited over the OSP on the copper pads. According to certain embodiments the lead-free solder paste comprises from 95.1 to 95.9 percent tin, and from 3.6 to 4.0 percent silver. In addition to tin and silver, in certain embodiments, the lead-free solder also comprises copper and the copper is present in an amount of up to 0.9 percent. According to certain embodiments the lead-free solder consists essentially of one or more materials selected from the group consisting of tin, silver and copper. Combinations of these materials are effective in combination with other materials and processing steps described herein to attain desirable attributes that are described elsewhere in this description. All percentages given above are in terms of weight. The solder paste that is utilized in block 406 suitably also comprises a Rosin Mildly Active (RMA) solder flux.

In block 408 electrical components are placed on the PWB 202 such that contact areas of the electrical components (e.g., the lower rim 202 of the RFI/EMI shield 104, the leads 112 of the microchip package 106, terminals of the discrete components 108, and the leads 114 of the connector 110) are in contact with the solder paste placed on the OSP on the pads. The components are suitably placed by an automated pick and place machine.

In block 410 the PWB 102 is heated in an air atmosphere to a temperature above a liquidous temperature of solder included in the solder paste. It is desirable to maintain the temperature of the PWB 102 above the liquidous temperature for at least 40 seconds in order to attain good solder joints.

As mentioned previously, it is expeditious and cost effective to deposit the solder paste for the entire PWB 102 using a non step down stencil, however doing so yields a uniform solder paste thickness for all components. Nonetheless using the process shown in FIG. 4 a stencil can be chosen to deposit a relatively thick solder paste in order to securely fix components that are mechanically stressed, and components that have a high coplanarity or planarity tolerance, and yet the thick solder paste does not lead to solder bridge shorts even for relatively closely spaced pads.

Alternatively, in block 406 solder paste is deposited by dispensing, e.g., automated dispensing.

Using the process shown in FIG. 4 printed wiring boards with inter-pad spacing as close as 0.1 mm can be made using a 0.15 mm thick deposit of solder paste. The process achieves high yield using without suffering significant amounts of electrical shorts due to solder bridges, and in the same process on the same PWB creates strong solder joints to components that are mechanically stressed and complete solder joints to components that have significant coplanarity or planarity tolerance, e.g. 0.1 mm. Using this process ratios of solder paste deposit thickness to inter-pad spacing in excess of 0.5 can be reliably used. This allows boards that have a mixture of components including components with relatively small lead spacing, components that are mechanically stressed, and components that have high coplanarity or planarity tolerances to be soldered to a PWB using a single solder procedure, i.e. one application of solder paste and one solder reflow. Although a range of deposited solder paste thickness can be used in the process, the process allows thick solder paste deposits in excess of 5 mils (0.127 mm) to be used without incurring solder bridges for closely spaced pads or solder deposits, e.g., spaced by less than 0.25 mm.

COMPARATIVE EXAMPLE

Figure 5:
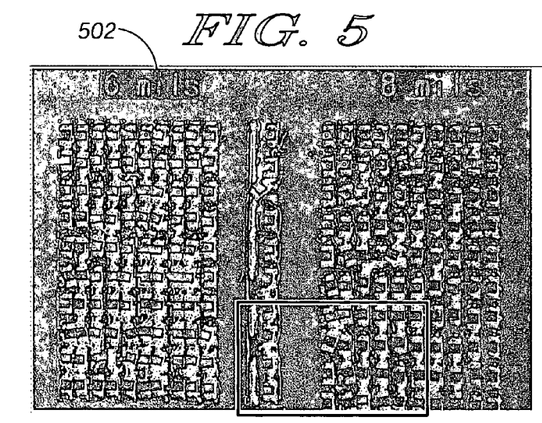
FIG. 5 is a top view of a populated printed wiring board used to evaluate a comparative example solder process.
Figure 6:
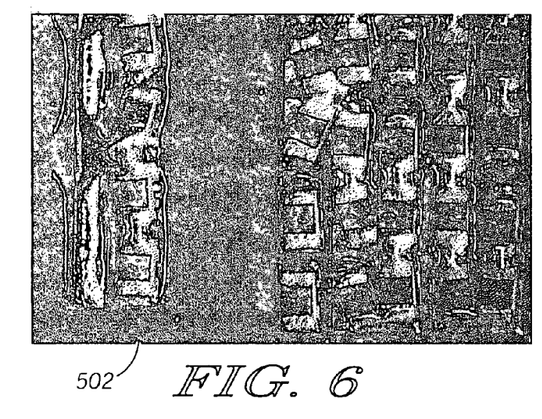
FIG. 6 is a magnified view of the populated printed wiring board shown in FIG. 5.

A first test PWB 502 shown in FIGS. 5–6 was fabricated. The first test PWB included an array of pads suitable for attaching discrete components. Pads of the first test PWB were coated with Entek OSP. In one area of the first test PWB the pads for adjacent devices were spaced by 8 mils (0.20 mm), and in a second area the pads for adjacent devices were spaced by 6 mils (0.15 mm). A 5 mil (0.127 mm) thick stencil was used to apply a solder paste that included a solder comprising 36% lead 64% tin and 2% silver and a RMA solder flux to the pads of the first test PWB. After application of the solder paste, surface mount resistors were placed on the first test PWB. The first PWB was then heated in by in an air atmosphere, to a temperature of 220 C. During the heating a temperature above 183 C. was maintained for 60 seconds. Then the first test PWB was allowed to cool and the state of the solder joints and discrete components was examined. As shown in FIGS. 5–6, numerous solder bridges formed, and many of the surface mount resistor shifted in position. The result was generally unacceptable.

EXAMPLE

Figure 7:
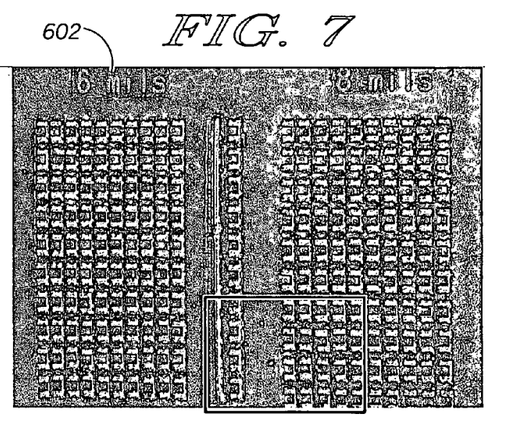
FIG. 7 is a top view of a populated printed wiring board used to evaluate the process illustrated in FIG. 4.
Figure 8:
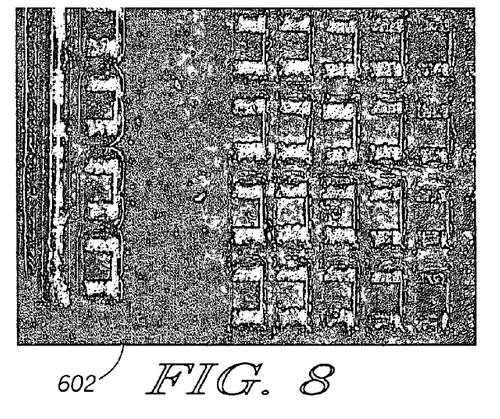
FIG. 8 is a magnified view of the populated printed wiring board shown in FIG. 7.

A second test circuit board 602 shown in FIGS. 7–8 was fabricated. The second test PWB included the same arrays of pads as the first test circuit board. Pads of the second test PWB were coated with Entek OSP. A 5 mill (0.127 mm) thick stencil was used to apply a solder paste that included a solder comprising 95.5 tin, 3.8% silver and 0.7% copper, and a RMA solder flux to the pads of the second test PWB. After application of the solder paste, surface mount resistors were placed on the second test PWB. The second PWB was then heated in an air atmosphere, up to a temperature of 235 C. During the heating a temperature above 217 C. was maintained for 70 seconds. The second test PWB was then allowed to cool and the state of the solder joints and discrete components was examined. As shown in FIGS. 7–8, no solder bridges formed, and the surface mount resistor stayed in position.

Figure 9:
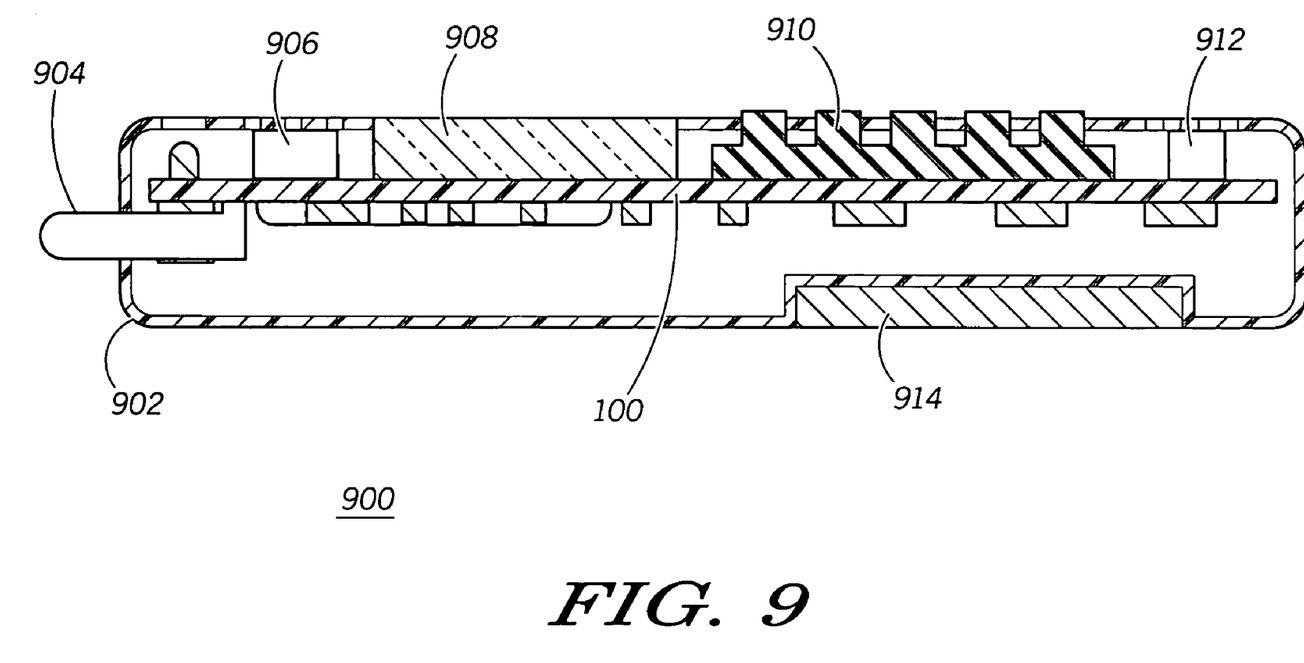
FIG. 9 is a sectional side view of a cellular telephone incorporating the populated printed wiring board shown in FIGS. 1–3.

FIG. 9 is a sectional side view of a cellular telephone 900 incorporating the populated PWB 100 shown in FIGS. 1–3. The cellular telephone 900 is built around the populated PWB 100. The cellular telephone 900 includes a housing 902 that supports and encloses the populated PWB 100 and a number of other parts including an antenna 904, earpiece speaker 906, a display 908, a keypad 910, a microphone 912, and a battery 914.

In the cellular telephone 900, the reduced inter-pad spacing of pads on the populated PWB 100 allows for more circuits to be included thereby providing greater functionality to the cellular telephone 900. Increased functionality can for example include video recording and playback, sophisticated audio processing, Global Positioning, etc.

Furthermore in as much as components on the major surface 103 of the PWB can be attached in a single soldering process, the cellular telephone 900 can be produced cost effectively which is a key concern for consumer products.

Moreover, the soldering processes described hereinabove achieve mechanically robust solder joints that are able to resist the stresses such as accidental dropping incurred in the day to day use of the cellular telephone.

Additionally, spurious radio emissions from components of the cellular telephone 900 are controlled shields that are properly joined by complete solder joints.

Figure 10:
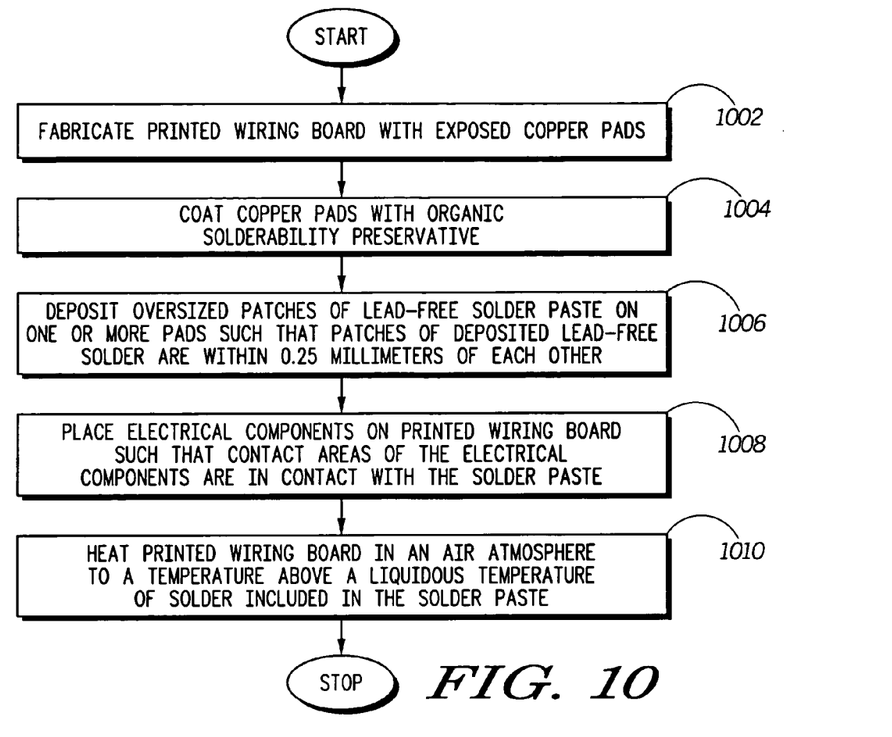
FIG. 10 is a flow chart of an embodiment of another process of manufacturing a populated printed wiring board.
Figure 11:
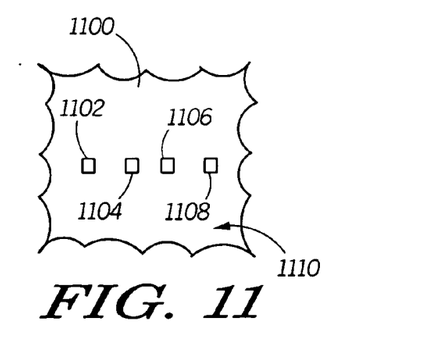
FIG. 11 is a fragmentary top view of a second printed wiring board at a first stage of the process shown in FIG. 10.

Referring to FIGS. 10–14 an additional embodiment will be described. FIG. 10 is a flow chart of the additional embodiment of a process of manufacturing a populated printed wiring board. Referring to FIG. 10 in block 1002 a PWB having exposed copper pads is fabricated. FIG. 11 is a fragmentary top view of a second PWB 1100 at a first stage of the process shown in FIG. 10. As shown in FIG. 11, the second PWB 1100 comprises a first copper pad 1102, a second copper pad 1104, a third copper pad 1106, and a fourth copper pad 1108 arranged on a surface 1110 the second PWB 1100.

Referring again to FIG. 10 in block 1004 the copper pads are coated with an OSP. The comments made above in the context of FIG. 4 with regard to the choice of OSP apply equally to the process shown in FIG. 10. In block 1006 oversized patches of lead-free solder paste are deposited on one or more of the OSP coated copper pads such that two or more patches of deposited lead-free solder paste are less than 0.25 millimeters from each other. The solder paste used in the process shown in FIG. 10 is of the same description as that described above in the context of FIG. 4.

Figure 12:
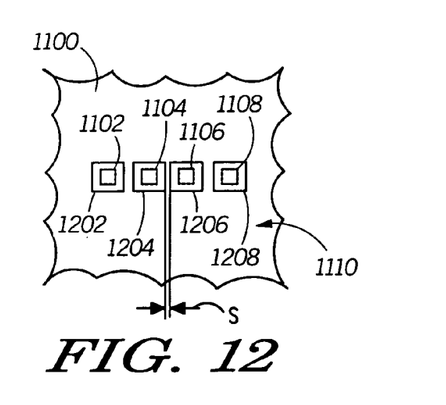
FIG. 12 is a fragmentary top view of the second printed wiring board at a second stage of the process shown in FIG. 10.
Figure 13:
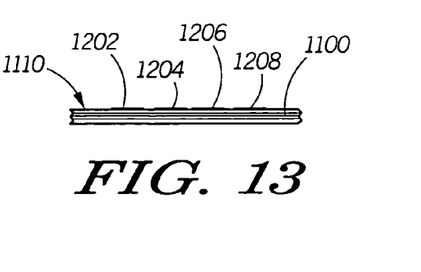
FIG. 13 is a fragmentary side view corresponding to the top view shown in FIG. 12.
Figure 14:
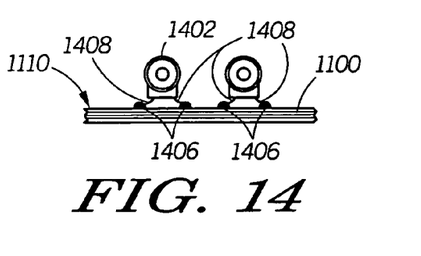
FIG. 14 is a fragmentary side view of the second printed wiring board after two connectors have been mounted.

FIG. 12 is a fragmentary top view of the second printed wiring board after oversized solder patches have been deposited. In FIG. 11 the copper pads 1102–1108 are shown in dashed outline. Covering the first through fourth copper pads 1102–1108 are a first 1202, a second 1204, a third 1206 and a fourth 1208 oversized solder patch respectively. The first 1102 and second 1104 copper pads are to be used to mount a first connector 1402 (FIG. 14), and the third 1106, and the fourth 1108 copper pads are to be used to mount a second connector 1404 (FIG. 14). Note that the second oversized patch of lead-free solder 1204, and the third oversized patch of lead-free solder 1206 are spaced from each other by a very small distance less that 0.25 mm indicated as 'S' in FIG. 12. Despite the small spacing S, by using the process illustrated in FIG. 10 electrical shorts due to solder bridges are minimized. FIG. 13 is a fragmentary side view corresponding to the top view shown in FIG. 12. (The copper pads 1102–1106 which are typically much thinner than the solder paste are not shown in FIG. 13.)

Referring again to FIG. 10, in block 1008, electrical components are placed on the PWB such that contact areas of the electrical components are in contact with the solder paste overlying the copper pads. In block 1010 the PWB is heated in an air atmosphere to a temperature above a liquidous temperature of solder included in the solder paste deposited in block 1006. The comments made in the context of FIG. 14 regarding the temperature and time of heating also apply to the process illustrated in FIG. 10. As a result of the process of FIG. 10, the solder paste which was deposited in oversized patches will coalesce onto the copper pads forming large solder joints.

Solder joints with a large amount of solder are useful for securing components that are mechanically stressed and for securing components that have significant planarity or coplanarity tolerances e.g. RFI/EMI shields. By allowing the patches 1102–1108 of deposited solder to be so close (e.g., less than 0.2 mm), the process illustrated in FIG. 10 enables large oversized patches of solder to be used in order to obtain solder joints with a large amount of solder without increasing the thickness of the deposited solder, or substantially increasing the area of the PWB. Accordingly, solder can be deposited over an entire PWB using a technique that lays down a uniform thickness of solder, such stenciling with a non step down stencil. Using a non step down stencil is a reliable and inexpensive way to apply solder. A relatively small thickness can be chosen to achieve very close component and/or component lead spacing for microchips and discretes and yet by the provision of oversized patches mechanically stressed components or components with high planarity or coplanarity tolerances can be reliably soldered.

FIG. 14 is a fragmentary side view of the second printed wiring board 1100 after the two connectors 1402, 1404 have been placed, and the solder paste 1202–1208 heated above the liquidous temperature and allowed to cool in order to form four solder joints 1406 to leads 1408 of the connectors 1402, 1404.

As used in the present description the term "lead-free" solder includes solder that is devoid of lead, and solder that is essentially devoid of lead, including solder that has unavoidable or unintentional trace amounts of lead.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A populated printed wiring board comprising:
    a printed wiring board comprising:
        a major surface;
        a plurality of copper pads on the major surface;
        a plurality of components including:
            one or more components selected from the group consisting of microchips and discrete components; and
            one or more components selected from the group consisting of electrical connectors and shields; and
    a plurality of solder joints between said plurality of copper pads, and said plurality of components, said plurality of solder joints comprising a lead-free solder, wherein said plurality of solder joints are formed by coating said copper pads with an organic solderability preservative, depositing a solder paste that includes said lead-free solder over said organic solderability preservative placing contact areas of the plurality of components in contact with said solder paste and heating said printed wiring board in an air atmosphere;
    wherein:
        said solder paste has a thickness T when applied to said copper pads;
        a minimum inter-pad spacing of said pads is S; and
        a ratio of the solder paste thickness to the minimum inter-pad spacing T/S is at least 0.5;
    wherein said plurality of components are all surface mounted onto said printed wiring board.

2. The populated printed wiring board according to claim 1 wherein at least a subset of said plurality of copper pads are spaced by an inter-pad spacing of less than 0.25 millimeters.

3. The populated printed wiring board according to claim 1 wherein:
    said solder consists essentially of one or more materials selected from the group including silver, tin, and copper.

4. The populated printed wiring board according to claim 1 wherein:
    said solder paste comprises rosin mildly activated flux.

5. The populated printed wiring board according to claim 1 wherein:
    said solder paste has a thickness of at least 0.127 millimeters when applied to said coated copper pads coated with said organic solderability preservative.

6. The populated printed wiring board according to claim 1 wherein:
    said solder comprises:
        95.1 to 95.9 percent tin;
        3.6 to 4.0 percent silver;

said solder paste comprises rosin mildly activated flux; and said solder paste has a thickness of at least 0.127 millimeters when applied to said copper pads coated with said organic solderability preservative.

7. The populated printed wiring board according to claim 1 wherein:

said plurality of components include one or more shields.

8. The populated wiring board according to claim 1 wherein:

said plurality of components include one or more electrical connectors.

9. The populated wiring board according to claim 1 comprising:

said organic solderability preservative on said copper pads.

10. The populated printed wiring board according to claim 1 wherein said solder comprises:

95.1 to 95.9 percent tin; and
3.6 to 4.0 percent silver.

11. The populated printed wiring board according to claim 10 wherein said solder comprises copper and the copper is present in an amount up to 0.9 percent.

12. A method of manufacturing a populated printed wiring board comprising;

manufacturing a printed wiring board that comprises a plurality of copper pads including exposed copper surfaces, said plurality of copper pads for surface mounting circuit components thereon;

coating the said copper pads with an organic solderability preservative;

depositing a solder paste that includes a lead-free solder on the organic solderability preservative coated copper pads, wherein;

said solder paste has a thickness T when applied to said copper pads;

a minimum inter-pad spacing of said pads is S; and a ratio of the solder paste thickness to the minimum inter-pad spacing T/S is at least 0.5;

positioning a plurality of circuit components on said printed wiring board, such that contact areas of the plurality of components are in contact with the solder paste; and heating the printed wiring board to a temperature above a liquidous temperature of said lead-free solder in an air atmosphere;

wherein said plurality of components are all surface mounted onto said printed wiring board.

13. The method of manufacturing a populated printed wiring board according to claim 12 wherein manufacturing the printed wiring board that comprises the plurality of copper pads comprises manufacturing a printed wiring board in which one or more of the pads have inter-pad spacing of less than 0.25 millimeters.

14. The method of manufacturing a populated printed wiring board according to claim 13 wherein:

coating said copper pads with an organic solderability preservative comprises coating said copper pads with an organic solderability preservative selected from the group consisting of substituted benzimidazole, benzotriazoles, and imidazole.

15. The method of manufacturing a populated printed wiring board according to claim 13 wherein:

coating said copper pads with an organic solderability preservative comprises coating said copper pads with substituted benzimidazole.

16. The method of manufacturing a populated printed wiring board according to claim 13 wherein:

heating the printed wiring board to a temperature above a liquidous temperature, comprises heating the printed wiring board to a temperature above the liquidous temperature of said lead-free solder for at least 40 seconds.

17. The method of manufacturing a populated printed wiring board according to claim 13 wherein:

depositing the solder paste comprises depositing the solder paste by stenciling using a non step down stencil.

18. The method of manufacturing a populated printed wiring board according to claim 13 wherein:

positioning a plurality of circuit components on said printed wiring board comprises positioning one or more components selected from a first group consisting of electrical connectors and shields on said printed wiring board, and one or more components selected from a second group consisting of microchips and discrete components.

19. The method of manufacturing a populated printed wiring board according to claim 13 wherein:

depositing the solder paste that includes the lead-free solder on the organic solderability preservative coated copper pads comprises depositing a solder past that includes a solder that consists essentially of one or more materials selected from the group consisting of tin, silver and copper.

20. The method of manufacturing a populated printed wiring board according to claim 19 wherein:

depositing the solder paste that includes the solder that consists essentially of one or more materials selected from the group consisting of tin, silver and copper comprises depositing a solder paste that comprises a rosin mildly active solder flux.

21. The method of manufacturing a populated printed wiring board according to claim 19 wherein:

depositing a solder paste that includes a lead-free solder on the organic solderability preservative coated copper pads comprises depositing a solder that comprises tin and silver.

22. A method of manufacturing a populated printed wiring board comprising:

fabricating a printed wiring board that includes a plurality of copper pads;

coating the copper pads with an organic solderability preservative;

depositing one or more oversized patches of a solder paste that includes a lead-free solder over the organic solderability preservative coated copper pads, wherein:

said solder paste has a thickness T when applied to said copper pads;

a minimum inter-pad spacing of said pads is S; and a ratio of the solder paste thickness to the minimum inter-pad spacing T/S is at least 0.5;

placing a plurality of electrical components on the printed wiring board such that contact areas of the plurality of electrical components are in contact with the solder paste overlying the copper pads; and heating the printed wiring board in an air atmosphere to a temperature above the liquidous temperature of the solder included in the solder paste.

23. The method of manufacturing a populated printed wiring board according to claim 22:

wherein two or more patches of solder paste that are deposited are spaced by less than 0.25 millimeters.

24. The populated printed wiring board according to claim 22 wherein:
said solder consists essentially of one or more materials selected from the group including silver, tin, and copper.

25. The populated printed wiring board according to claim 22 wherein:
said solder paste comprises rosin mildly activated flux.

26. The populated printed wiring board according to claim 22 wherein:
said plurality of components include one or more shields.

27. The populated wiring board according to claim 22 wherein:
said one or more electrical components include one or more electrical connectors.

28. The populated printed wiring board according to claim 22 wherein:
said solder comprises:
95.1 to 95.9 percent tin; and
3.6 to 4.0 percent silver.

29. The populated printed wiring board according to claim 28 wherein:
said solder comprises copper and the copper is present in an amount up to 0.9 percent.

* * * * *